United States Patent [19]
Cascini

[11] Patent Number: 5,067,648
[45] Date of Patent: Nov. 26, 1991

[54] APPARATUS FOR HOLDING PRINTED CIRCUIT BOARDS DURING WAVE SOLDERING AND PROCESSING

[75] Inventor: Michael R. Cascini, Hudson, N.H.
[73] Assignee: Lockheed Sanders, Inc., Nashua, N.H.
[21] Appl. No.: 559,869
[22] Filed: Jul. 27, 1990
[51] Int. Cl.$^5$ .................... B23K 37/04; B25B 1/20
[52] U.S. Cl. .................................. 228/47; 228/43; 118/503; 269/903
[58] Field of Search .................... 228/36–40, 228/43, 47, 259, 180.1; 118/428, 503; 269/903

[56] References Cited
U.S. PATENT DOCUMENTS

| | | | |
|---|---|---|---|
| 4,030,717 | 6/1977 | Serlovsky | 228/37 |
| 4,291,867 | 9/1981 | Williams et al. | 269/903 |
| 4,948,108 | 8/1990 | Sullivan | 269/903 |

OTHER PUBLICATIONS
EMC Domestic, Inc., Product Brochure, pp. 4, 5 and 8.
Fancort Industries, Inc., Insertion/Solder/Assembly Fixtures, pp. 3–5.
EES, PCB Workboard Holders and Flow Solder Carriers, pp. 3 and 5.

Primary Examiner—Samuel M. Heinrich
Attorney, Agent, or Firm—David W. Gomes

[57] ABSTRACT

An apparatus for supporting printed circuit boards during processing provides a peripheral frame, a multiplicity of support members having interfacing flat surfaces defining an imaginary reference plane from both sides thereof and clips for supporting printed circuit boards parallel and in reference to the imaginary plane which clips engage the support members along either of the interfacing surfaces defining the reference plane.

8 Claims, 2 Drawing Sheets

APPARATUS FOR HOLDING PRINTED CIRCUIT BOARDS DURING WAVE SOLDERING AND PROCESSING

BACKGROUND OF THE INVENTION

1. Field of the Invention

This invention generally relates to fixtures for holding printed circuit boards during processing and, in particular, to such fixtures as are used during wave soldering operations.

2. Statement of the Prior Art

Fixtures used for the wave soldering of printed circuit boards are relatively common and generally include a peripheral frame and various members for supporting the boards in reference to the frame. The fixtures typically establish a reference plane using upwardly facing surfaces of the frame and/or support members. The clamps for holding the boards may be variably affixable to these upwardly facing surfaces and thereby determine the position of the circuit board with respect to the reference plane.

Several considerations are important for such circuit board fixtures. The variability of the support members is very important as it allows a wide variety of circuit boards to be processed using the same fixture. This reduces the procurement, storage and handling costs associated with having a large number of different fixtures. Also, this variability should be sufficient to allow for boards having different shapes as well as different sizes. Further, the complexity of the fixture should be minimized to reduce setup time during processing as well as the system cost of having a great many different parts.

SUMMARY OF THE INVENTION

Accordingly, the present invention provides an apparatus for supporting a printed circuit board during processing which includes a very high degree of variability for accommodating boards having different sizes and shapes while requiring a minimum number of complimentary support members.

The apparatus includes a peripheral frame, a multiplicity of support members having interfacing flat surfaces defining an imaginary reference plane from both sides thereof, means for affixing two or more support members to the peripheral frame, and means for supporting printed circuit boards parallel to and in reference to the imaginary plane and including means for engaging the support members along either of the interfacing surfaces defining the reference plane.

In a refined version, each of the support members is elongated and has an elongated slot located therein and in the elongated direction of the member for allowing infinite adjustability for interconnection therewith.

In a further refinement, the means for supporting includes a plurality of mounting members with each being adapted to be affixed to a defining surface of a support member and including means for engaging a printed circuit board and determining the position of the engaged printed circuit board with respect to the defining surface to which the mounting member is affixed.

BRIEF DESCRIPTION OF THE DRAWINGS

The present invention is illustratively described in reference to the accompanying drawings of which.

DETAILED DESCRIPTION OF THE DRAWINGS

Figure 1:
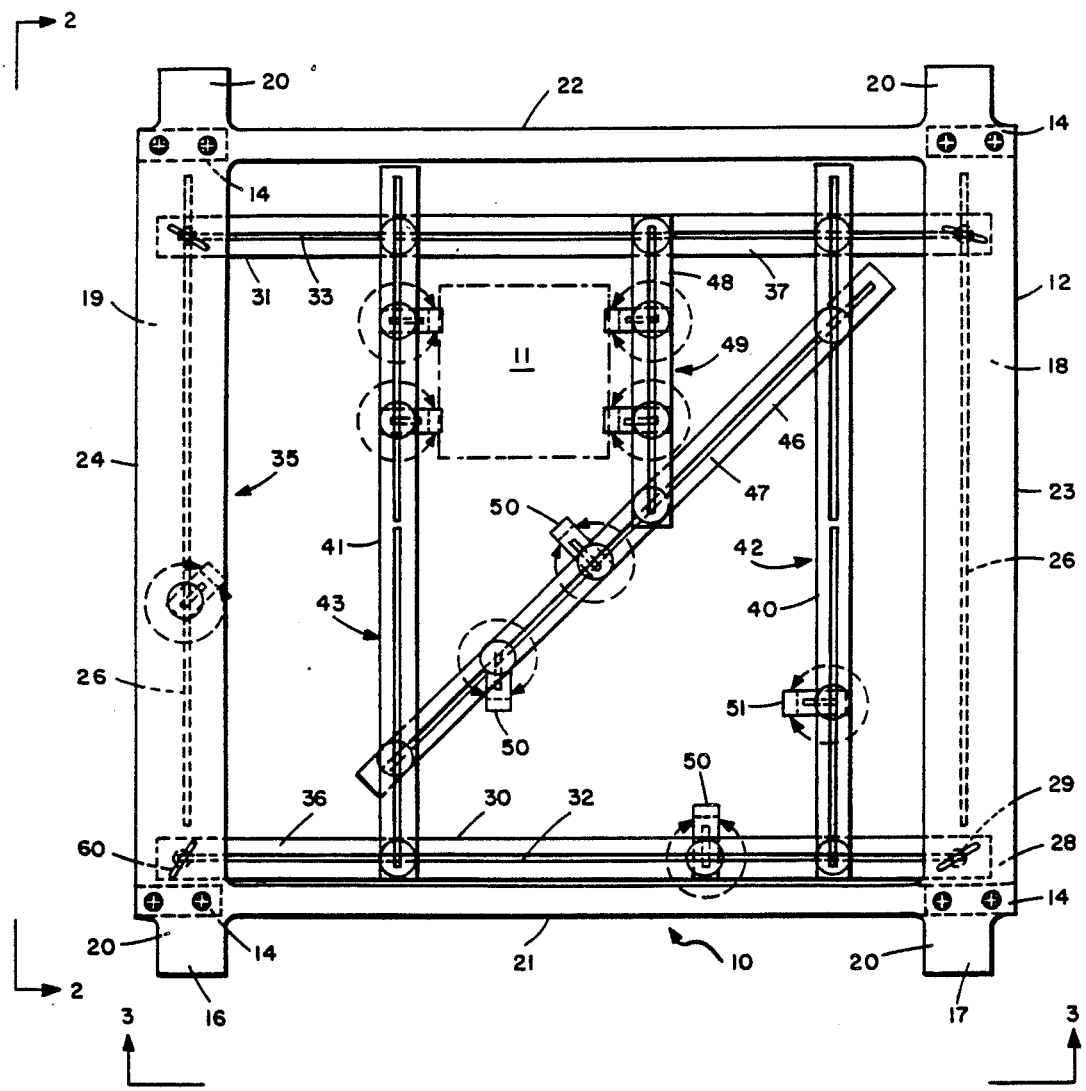
FIG. 1 is a top view of an apparatus constructed according to one embodiment of the present invention.
Figure 2:
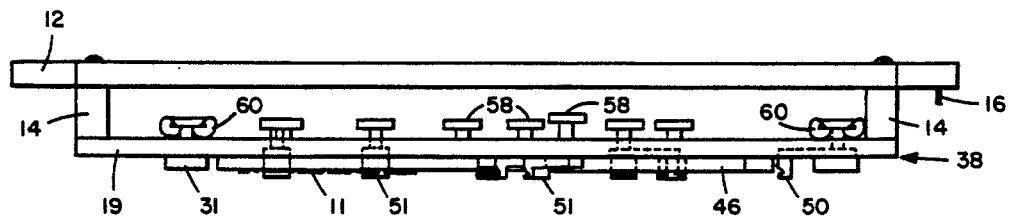
FIG. 2 is an end view of the apparatus of FIG. 1 taken along view lines 2—2.
Figure 3:
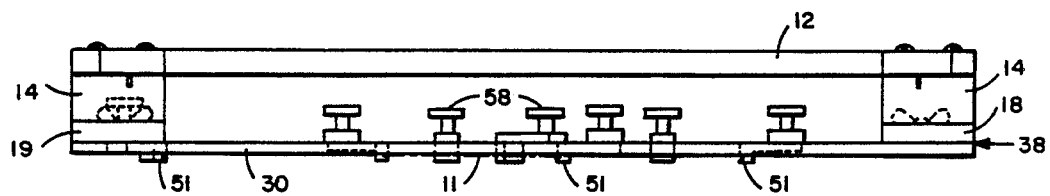
FIG. 3 is a side view of the apparatus of FIG. 1 taken along view lines 3—3.
Figure 4C:
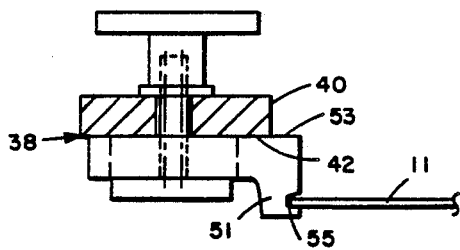
FIGS. 4a–4d are various views of mounting hardware used in combination with the apparatus of FIG. 1.
Figure 4A:
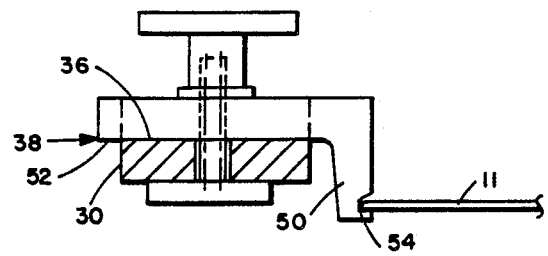
Figure 4D:
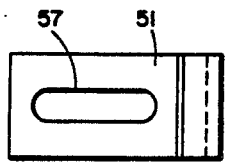
Figure 4B:
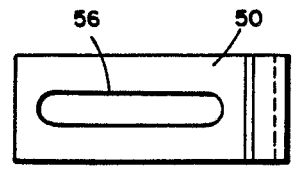

FIGS. 1, 2 and 3 show an apparatus 10 for supporting printed circuit boards such as the board 11 during the processing thereof. Generally included are a peripheral frame 12, standoffs 14, a plurality of support members, and drive pins 16,17. Peripheral frame 12 is constructed from a single flat piece of metal such as aluminum and includes four tabs 20 which extend from the sides 21,22 for supporting the apparatus 10 and its contents through wave soldering and other processing applications. Frame 12 is designed to be transported in the direction of either end 23,24. For the purpose of mechanized drive, pins 16,17 are affixed to tabs 20 of frame 12.

Standoffs 14 are also used at each corner of frame 12 for affixing an elongated support member 18,19 to each end 23,24 of the frame 12. Support members 18,19 are simply, rectangularly cross-sectioned metal bars which are laterally affixed to the frame 12 and have an elongated slot 26 extending substantially the entire length thereof. Slots 26 are used for mounting additional support members to the frame structure. In the embodiment shown, the slots 26 do not extend the entire useful length thereof, but rather stop short of the end 28, and an additional mounting hole 29 is located in line with the slot 26. The use of the slots 26 instead of holes like 29 enables a great deal of flexibility in the mounting of support members. On the other hand, the use of fixed holes 29 provides for fixed referencing of other members.

Longitudinal support member 30 is affixed to the bottom side of the members 18,19, while longitudinal support member 31 is variably affixed to the bottom side of members 18,19 to allow adjustable positioning for accommodating printed circuit boards of various sizes and shapes. Longitudinal members 30,31 are simply rectangularly cross-sectioned metal bars having elongated slots 32,33 running the entire length thereof. The elongated slots 32,33 serve all of the necessary mounting purposes; both for mounting the members 30,31 to the lateral members 18,19 and for mounting additional support members therefrom.

The interconnection of the lateral members 18,19 and the longitudinal members 30,31 embody an important feature of the apparatus 10, which feature is the definition of an imaginary reference plane 38 by both the flat, dowardly facing surfaces 34,35 of members 18,19 and the flat, upwardly facing surfaces 36,37 of members 30,31. These surfaces 34–37 interface with each other and thereby define the imaginary reference plane 38 from both sides thereof. The imaginary plane 38 serves as a reference for the mounting of all printed circuit boards to assure the proper mounting height for wave soldering and any other operations.

The definition of the imaginary plane is continued by all additional support members which alternately interconnect from opposite sides of the plane 38 and have flat interfacing surfaces for further defining the plane. This procedure is demonstrated by lateral members 40,41 having downwardly facing, flat surfaces 42,43; diagonal member 46 having upwardly facing, flat surface 47; and lateral member 48 having downwardly facing, flat surface 49. These members have one or two elongated slots which, like slot 32 of member 30 serves all of the support members' mounting needs.

The slots also afford a great deal of flexibility in the positioning of support members throughout this extended support structure. It should be noted that the location of the support members shown in the figures are merely illustrative of the different relative positions possible therebetween and are not the only locations that these members can take. It is typical that the actual locations used serve the purposes of ease and efficiency of pallet use. For example, the fewer the number of support members, the greater the space for circuit boards. Further, the variety of different locations is only limited by the ingenuity of the operator.

The mounting of any circuit board to apparatus 10 is accomplished by the use of just two different mounting clips 50,51, shown most clearly in FIGS. 4a–4d. Clip 50 has a flat surface 52, which is designed to interface with the reference plane 38 as defined by an upwardly facing surface such as 36 of support member 30, and includes a lip 54 for determining the position of a printed circuit board 11 with respect to plane 38. Clip 51 has a flat surface 53, which is designed to interface with reference plane 38 as defined by a downwardly facing surface such as 42 of support member 40, and includes a lip 55 for determining the position of printed circuit board 11 with respect to plane 38. Clips 50,51 may be formed from any suitable material such as aluminum or high temperature plastic.

Each clip 50,51 has the same dimension (one-half inch, 1.27 cm) between its respective interfacing surface 52,53 and its respective circuit board lip 54,55 which determines the distance between reference plane 38 and the bottom of circuit board 11. Each clip 50,51 also includes a slightly elongated slot 56,57 for allowing adjustable positioning with respect to a supporting member. Also, any number of clips 50,51 may be used on a printed circuit board depending upon its nature.

The interconnection of the support members 18, 19, 30, 31, 40, 41, 46, 48 and the mounting clips 50,51 is all accomplished with simple thumbscrew 58 or wingnut 60 hardware to allow an operator to easily rearrange the apparatus 10 for different circuit boards. Wingnuts 60 are only used where the clearance from frame 12 is limited. Also, the exchange of circuit boards during processing may be typically effected by the use of one or two thumbscrews.

Conclusion

Based upon this extremely flexible and extensive support structure and its functional definition of the imaginary reference plane, a wide variety of printed circuit boards may be mounted and processed using the present invention. The apparatus 10 requires only a limited number of parts for reduced system cost. Support members differ only in length, and the apparatus requires only two different clips and one kind of mounting hardware. The apparatus parts are also very simple in nature requiring only limited amounts of operator training.

The embodiments described above are intended to be taken in an illustrative and not a limiting sense. Various modifications and changes may be made to the above embodiments by persons skilled in the art without departing from the scope of the present invention as defined in the appended claims.

What is claimed is:

1. An apparatus for supporting printed circuit boards during processing, comprising:
   a peripheral frame;
   a multiplicity of support members having interfacing flat surfaces defining an imaginary reference plane from both sides thereof;
   means for affixing two or more support members to the peripheral frame; and
   means for supporting printed circuit boards parallel to and in reference to the imaginary plane and including means for engaging the support members along either of the interfacing surfaces defining the reference plane.

2. The apparatus of claim 1, wherein the support members are affixed to each other at their respective interfacing surfaces.

3. The apparatus of claim 2, wherein interfacing surfaces of the support members define the plane from alternating sides thereof.

4. The apparatus of claim 3, wherein the frame is square or rectangular, and further wherein two of the support members are located on opposite ends of the frame.

5. The apparatus of claim 4, wherein each of the support members is elongated and has an elongated slot located therein and in the elongated direction of the member for allowing infinite adjustability for interconnection with both other support members and the means for supporting printed circuit boards.

6. The apparatus of claim 5, wherein the elongated support members may be affixed to each other at an infinitely adjustable angle between the elongated directions.

7. The apparatus of claim 6, wherein the means for supporting includes a plurality of mounting members with each being adapted to be affixed to a defining surface of a support member and including means for engaging a printed circuit board and determining the position of the engaged printed circuit board with respect to the defining surface to which the mounting member is affixed.

8. The apparatus of claim 7, wherein the plurality of mounting members includes two different mounting members, with a separate one for determining the position of the printed circuit board from each side of the imaginary plane.

* * * * *